US008779729B2

(12) United States Patent
Shiraishi

(10) Patent No.: US 8,779,729 B2
(45) Date of Patent: Jul. 15, 2014

(54) ELECTRIC STORAGE DEVICE MONITOR

(75) Inventor: Takeyuki Shiraishi, Kyoto (JP)

(73) Assignee: GS Yuasa International Ltd., Kyoto-shi (JP)

( * ) Notice: Subject to any disclaimer, the term of this patent is extended or adjusted under 35 U.S.C. 154(b) by 0 days.

(21) Appl. No.: 13/606,698

(22) Filed: Sep. 7, 2012

(65) Prior Publication Data
US 2013/0067256 A1 Mar. 14, 2013

(30) Foreign Application Priority Data

Sep. 9, 2011 (JP) ................. 2011-197077
Aug. 9, 2012 (JP) ................. 2012-176839
Sep. 7, 2012 (JP) ................. 2012-197187

(51) Int. Cl.
*H02J 7/04* (2006.01)
*H02J 7/16* (2006.01)
*H02J 7/00* (2006.01)

(52) U.S. Cl.
USPC ........... 320/155; 320/134; 320/156; 320/157; 324/426

(58) Field of Classification Search
USPC ............................ 324/426; 320/155, 156, 157
See application file for complete search history.

(56) References Cited

U.S. PATENT DOCUMENTS

| 5,057,383 | A | * | 10/1991 | Sokira | 429/92 |
| 5,760,720 | A | | 6/1998 | Nolan et al. | |
| 5,955,869 | A | | 9/1999 | Rathmann | |
| 6,020,717 | A | | 2/2000 | Kadouchi et al. | |
| 6,047,380 | A | | 4/2000 | Nolan et al. | |
| 2007/0188150 | A1 | | 8/2007 | Yamaguchi et al. | |
| 2009/0027056 | A1 | * | 1/2009 | Huang et al. | 324/439 |
| 2009/0237032 | A1 | * | 9/2009 | Nam et al. | 320/116 |
| 2010/0213900 | A1 | * | 8/2010 | Carrier et al. | 320/134 |

FOREIGN PATENT DOCUMENTS

| EP | 0048767 | 10/1991 |
| JP | 08-140204 | 5/1996 |
| JP | 2001-056362 | 2/2001 |
| JP | 2001-313081 | 11/2001 |
| JP | 2006-047130 | 2/2006 |
| JP | 2007-216838 | 8/2007 |
| JP | 2007-230398 | 9/2007 |

OTHER PUBLICATIONS

Extended European Search Report dated Mar. 12, 2013 filed on a European Patent Application No. 12006310.2.

* cited by examiner

*Primary Examiner* — Drew A Dunn
*Assistant Examiner* — Nathaniel Pelton
(74) *Attorney, Agent, or Firm* — Rankin, Hill & Clark LLP

(57) ABSTRACT

An electric storage device monitor includes a measurement unit detecting and obtaining a detected value, a power supply switch portion switching a power supply state of the monitor between a monitoring state and a low power consumption state, a wakeup timer to which an actuation time is set and starting counting time in response to switching to the low power consumption state and continuing counting time and outputting an actuation signal if reaching the actuation time, and a control unit. The switch portion switches from the low power consumption state to the monitoring state every time the wakeup timer outputs the actuation signal. The control unit controls the measurement unit to detect and obtain the detected value in the monitoring state, compares the detected value and a reference value, and changes the actuation time according to a comparison result of the detected value and the reference value.

12 Claims, 9 Drawing Sheets

ELECTRIC STORAGE DEVICE MONITOR

CROSS REFERENCE TO RELATED APPLICATION

This application claims priority from Japanese Patent Application Nos. 2011-197077 filed on Sep. 9, 2011, 2012-176839 filed on Aug. 9, 2012, and 2012-197187 filed on Sep. 7, 2012. The entire contents of the priority applications are incorporated herein by reference.

FIELD OF THE INVENTION

The present invention relates to a technology of monitoring a state of an electric storage device.

BACKGROUND OF THE INVENTION

A battery monitor executes a voltage measurement mode and a sleep mode alternately to reduce power consumption of a secondary battery.

While the secondary battery is used, the battery monitor that monitors the secondary battery usually receives an actuation signal from a load side and is actuated to be switched from the sleep mode to the voltage measurement mode. Therefore, the battery monitor continuously monitors the state of the secondary battery while the secondary battery is used.

However, if the secondary battery is separated from the load to be used or an error or a problem occurs in the communication between the secondary battery and the load, the battery monitor cannot receive the actuation signal from the load side. There has been no consideration for dealing with such a case. This kind of problem occurs in other elements than the secondary battery, for example, capacitors.

SUMMARY OF THE INVENTION

The present technology has been made in view of the above, and it is an object of the technology to deal with a state that a monitor cannot receive an actuation signal from the load side.

The present invention provides a monitor monitoring an electric storage device that includes a measurement unit, a power supply switch portion, a wakeup timer, and a control unit. The measurement unit is configured to detect a state of the electric storage device and obtain a detected value. The power supply switch portion is configured to switch a power supply state of the monitor between a monitoring state and a low power consumption state that requires lower power than the monitoring state. An actuation time is set to the wakeup timer and the wakeup timer is configured to start counting time in response to switching to the low power consumption state by the power supply switch portion and continue counting time until reaching the setting time and output an actuation signal if reaching the setting time. The power supply switch portion switches the power supply state of the monitor from the low power consumption state to the monitoring state every time the wakeup timer outputs the actuation signal. The control unit is configured to control the measurement unit to detect the state of the electric storage device and obtain the detected value when the power supply state of the monitor is set in the monitoring state by the power supply switch portion. The control unit is further configured to compare the detected value and a reference value and change the actuation time according to a comparison result of the detected value and the reference value.

DESCRIPTION OF THE PREFERRED EMBODIMENTS

According to the present technology, if the detected value is changed, the actuation time is also changed. Thus, the monitor may monitor the electric storage device more frequently. Accordingly, it is promptly detected that the electric storage device such as a secondary battery is used in a condition that the monitor cannot receive an actuation signal from the load side. Further, even if the state of the electric storage device such as a secondary battery is changed, it is less likely to occur that the electric storage device is not monitored for a long time. Therefore, the electric storage device is less likely to be in an abnormal state such as an overcharged or over discharged state. In this description, when the detected value changes, it means that the detected value changes from an objective value such as a previous value that is detected prior to a detected value.

First Embodiment

A first embodiment will be described with reference to FIGS. 1 to 4.

Figure 1:
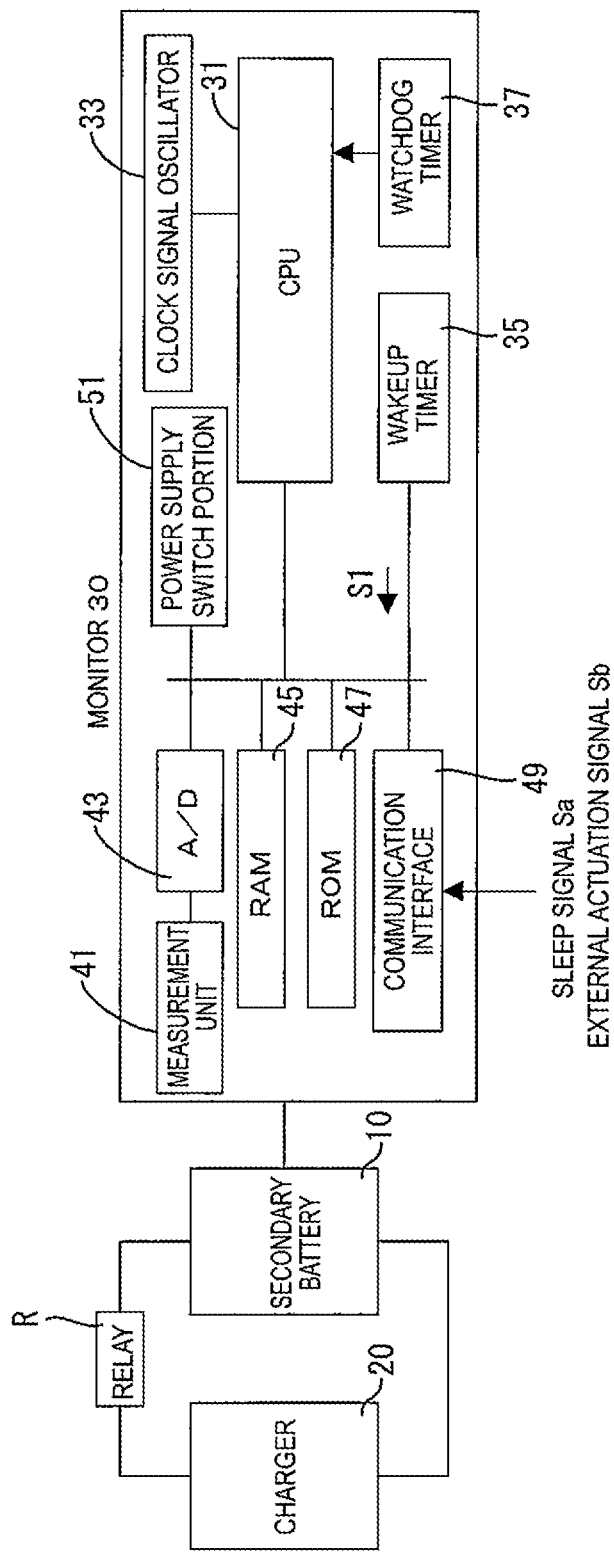
FIG. 1 is a block diagram illustrating an electric configuration of a monitor according to a first embodiment.

A monitor 30 is connected to a secondary battery 10 and integrally provided therewith. The secondary battery 10 is an example of an electric storage device. The monitor 30 monitors a state of the secondary battery 10, specifically, voltage, temperature, and current values of the battery. As illustrated in FIG. 1, the monitor 30 includes a CPU 31, a clock signal oscillator 33, a wakeup timer 35, a watchdog timer 37, a measurement unit 41, an A/D converter 43, a RAM 45, a ROM 47, and a communication interface 49 and a power supply switch portion 51. The CPU 31 is an example of a control unit and the RAM 45 is an example of a memory.

The measurement unit 41 detects voltage (inter-terminal voltage), temperature, and current values of the secondary battery 10. The A/D converter 43 converts detected values of the voltage, the temperature, and the current of the secondary battery 10 into digital values and outputs them to the CPU 31. The CPU 31 receives information such as the voltage and the current of the secondary battery 10 via the A/D converter 43 and analyzes them to monitor the state of the secondary battery 10 and check if the battery is in an abnormal state or not. The RAM 45 is used as a working memory of the CPU 31 and the RAM 45 stores the detected values. The ROM 47 stores a program that performs an actuation period change sequence and data necessary for various calculations.

The power supply switch portion 51 receives an internal actuation signal S1, a sleep signal Sa and an external actuation signal Sb. Upon receiving one of the signals, the power supply switch portion 51 switches a power supply state of the monitor 30 between a monitoring state and a sleep state. The sleep state is an example of a low power consumption state. The monitor 30 has two modes including a measurement mode and a sleep mode that is a low power consumption mode. In the measurement mode, the power supply state of the monitor 30 is maintained in the monitoring state and the monitor 30 detects the voltage, temperature, and current values of the secondary battery 10 to continuously monitor the state of the battery and power is supplied to all components of the monitor 30.

In the sleep mode, the monitor 30 is set to alternately in the monitoring state and the sleep state. In the sleep state, the monitor 30 is in a standby state. In the sleep mode, the power supply switch portion 51 temporally switches the power supply state of the monitor 30 from the sleep state to the monitoring state every actuation period T the power supply switch portion 51 receives the internal actuation signal S1 from the wakeup timer 35. The monitor 30 monitors the state of the battery only in the monitoring state, and thereafter, the monitor 30 is switched to be in the sleep state. The wakeup timer 35 counts time and if the time counted by the wakeup timer 35 reaches the actuation period T, the wakeup timer 35 outputs the internal actuation signal S1 to the power supply switch portion 51. Accordingly, the monitor 30 is switched from the sleep state to the monitoring state with the certain actuation period T. In the monitoring state, the measurement unit 41 of the monitor 30 detects a voltage, a current, and a temperature of the secondary battery 10.

In the sleep state, only the clock signal oscillator 33, the wakeup timer 35, the communication interface 49, and the power supply switch portion of the monitor 30 are supplied with power and supply of power to the other components is stopped, thereby reducing power consumption in the secondary battery 10. The monitor 30 is supplied with power from the secondary battery 10 and therefore, if the monitor 30 is in the sleep state, the consumption power in the secondary battery 10 can be reduced.

The monitor 30 is switched between the measurement mode and the sleep mode according to two control signals including the sleep signal Sa and the external actuation signal Sb output from a control system of the load side. In a case that the secondary battery 10 is mounted to a vehicle, a vehicle-mounted ECU selectively outputs one of the two control signals Sa, Sb. If the secondary battery 10 is not used for a certain time period and the battery 10 is not required to be charged, the control system of the load side detects conditions for switching the monitor 30 to the sleep mode and determines that the monitor 30 is to be switched to the sleep mode. In such a case, the control system of the load side outputs the sleep signal Sa to the monitor 30 and the CPU 31 of the monitor 30 receives the sleep signal Sa via the communication interface 49. Accordingly, the monitor 30 is switched to be in the sleep mode. Namely, the state of the battery 10 is basically not changed while the monitor 30 is in the sleep mode.

The load-side control system outputs the external actuation signal Sb to the monitor 30 to use the battery 10 and the monitor 30 receives the external actuation signal Sb via the communication interface 49. Accordingly, the monitor 30 is switched to be in the measurement mode. Therefore, if the monitor 30 is properly connected to the load and can receive the external actuation signal Sb from the load, the monitor 30 monitors the state of the secondary battery 10 that is being used.

However, if the secondary battery 10 is separated from the load to be used or an error or a problem occurs in the communication between the monitor 30 and the load side, the monitor 30 does not receive the external actuation signal Sb from the load side. Therefore, the monitor 30 remains in the sleep mode and monitors the battery repeatedly with the certain period. If the secondary battery 10 is charged improperly, the battery 10 may be in an abnormal state such as overcharge or over discharge during a period between a current monitoring and a subsequent monitoring.

In the present embodiment, if determining that a current detected battery voltage of the secondary battery 10 is changed from a previous detected battery voltage in the sleep mode, the monitor 30 changes the actuation period T. Specifically, in response to such determination, the CPU 31 shortens the actuation period T so that the monitor 30 monitors the secondary battery 10 more frequently with a shorter period. Accordingly, it can be detected promptly that the secondary battery 10 is used in a condition that the monitor 30 cannot receive the external actuation signal Sb from the load side. Further, the voltage of the secondary battery 10 does not reach the prohibited level.

Figure 2:
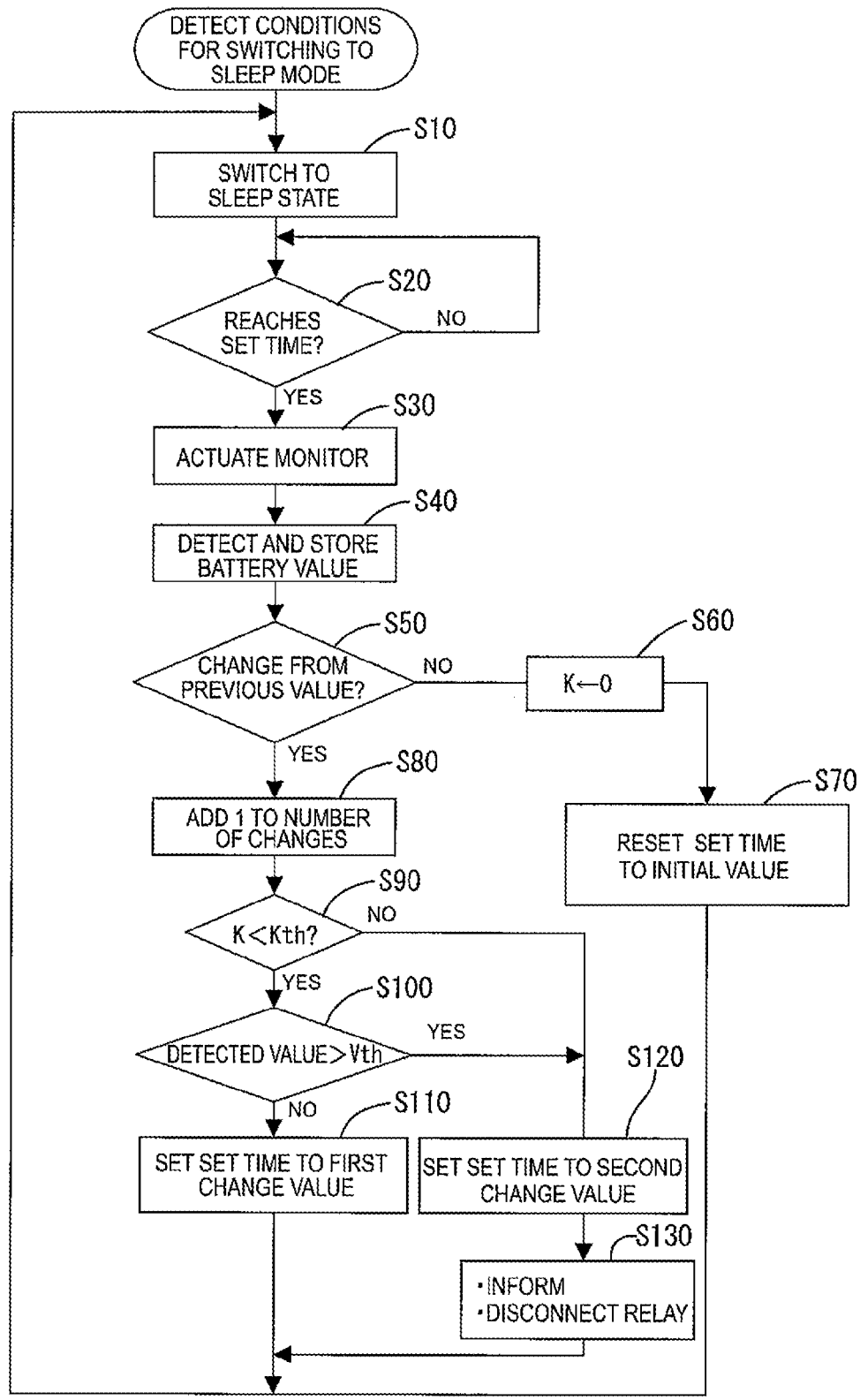
FIG. 2 is a flowchart illustrating a flow of processing of an actuation period change sequence.

An actuation period change sequence will be explained with reference to FIG. 2. In the actuation period change sequence, the actuation period T of the monitor 30 is changed. It is assumed that the secondary battery 10, the charger 20, the relay R, and the monitor 30 are mounted to the load side and a time set to the wakeup timer 35, that is, the initial value of the actuation period T is 60 seconds, for example. A number of continuous changes K that will be described later is zero.

The actuation period change sequence starts in response to detection of conditions for switching the monitor 30 from the measurement mode to the sleep mode and output of the sleep signal Sa from the load side to the monitor 30.

If the CPU 31 receives the sleep signal Sa, the monitor 30 is switched to the sleep mode and set to be in the sleep state that reduces consumption power. In the sleep mode, only the clock signal oscillator 33, the wakeup timer 35, the communication interface 49, and the power supply switch portion 51 are supplied with power to be operated and supply of power to the other components is stopped (S10).

After the monitor 30 is switched to the sleep state, the wakeup timer 35 starts counting time and detects whether the counted time reaches the set time. If the time counted by the wakeup timer 35 reaches the set time (S20), the wakeup timer 35 outputs the internal actuation signal S1 to the power supply switch portion 51. The initial value of the set time is 60 seconds. If 60 seconds passes after the monitor 30 becomes in the sleep state, the wakeup timer 35 outputs the internal actuation signal S1 to the power supply switch portion 51.

If receiving the internal actuation signal S1, the power supply switch portion 51 supplies power to each component of the monitor 30 to actuate the monitor 30 (S20, S30). Then, the measurement unit 41 detects voltage, temperature, and current values of the secondary battery 10 (S40).

The values detected by the measurement unit 41 are converted into digital values by the A/D converter 43 and transferred to the CPU 31 and stored in the RAM 45 (S40). The CPU 31 determines whether the current detected value changes (S50). Specifically, the CPU 31 compares the current detected value and a previous detected value stored in the RAM 45 and determines whether the current detected value of the secondary battery 10 changes from the previous detected value (S50). If the current detected voltage of the secondary battery 10 changes from the previous detected voltage by at least a predetermined value (for example, 0.05 V), it is preferably determined that the detected battery value is changed. Accordingly, it is not erroneously determined that the battery value is changed according to very small change in the battery voltage that may be caused due to a situation or an environment in which the monitor 30 is used. Such a very small change in the battery voltage may be caused even if improper charging is not executed.

No previous detected value is stored in the RAM 45 in the first determination just after the monitor 30 is switched to the sleep mode. Therefore, the detected value that is most recently detected in the measurement mode immediately before the monitor 30 is switched to the sleep mode is used as the previous detected value. If the CPU 31 determines that the current detected value does not change from the previous detected value (S50), the process proceeds to S70.

In S70, the set time of the wakeup timer 35 is maintained to be the initial value. Then, the process returns to S10 and the monitor 30 is switched to the sleep state again. Then, if the wakeup timer 35 determines that the counted time reaches the set time, the timer 35 outputs the internal actuation signal S1 to the power supply switch portion 51 and accordingly, the monitor 30 is actuated (S20, S30).

In such a manner, the monitor 30 is actuated and detects the voltage, temperature, and current values of the secondary battery 10. If no change is detected in voltage of the secondary battery 10, a negative decision (NO) is made in S50 and the number of continuous changes K is set to be zero (S60). Therefore, the set time of the wakeup timer 35 is maintained to be the initial value (S70).

Figure 3:
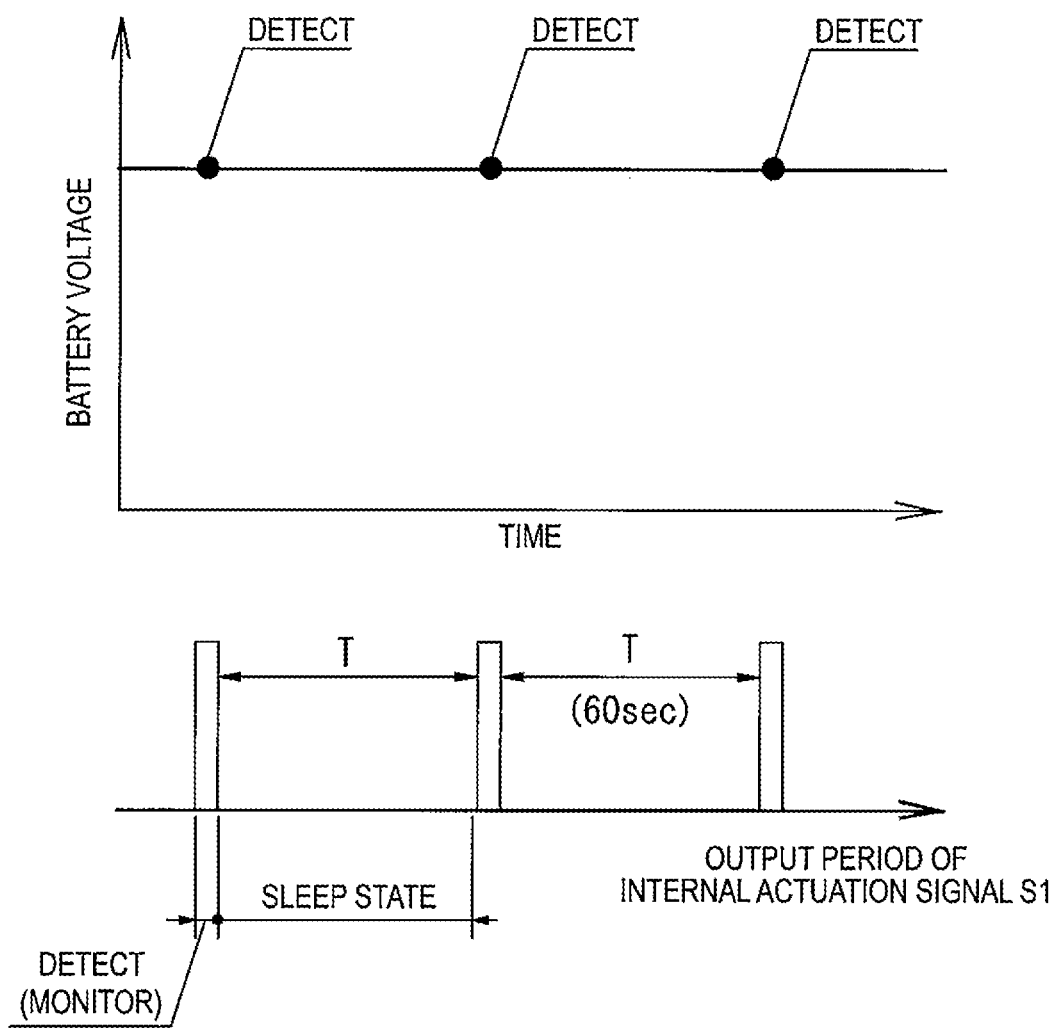
FIG. 3 is a graph illustrating an actuation period with which the monitor is actuated if a battery voltage is not changed.

Therefore, as long as the detected value of the battery voltage is not changed from the previous detected value, the monitor 30 is repeatedly actuated to monitor the state of the secondary battery 10 at the initial interval as illustrated in FIG. 3.

Figure 4:
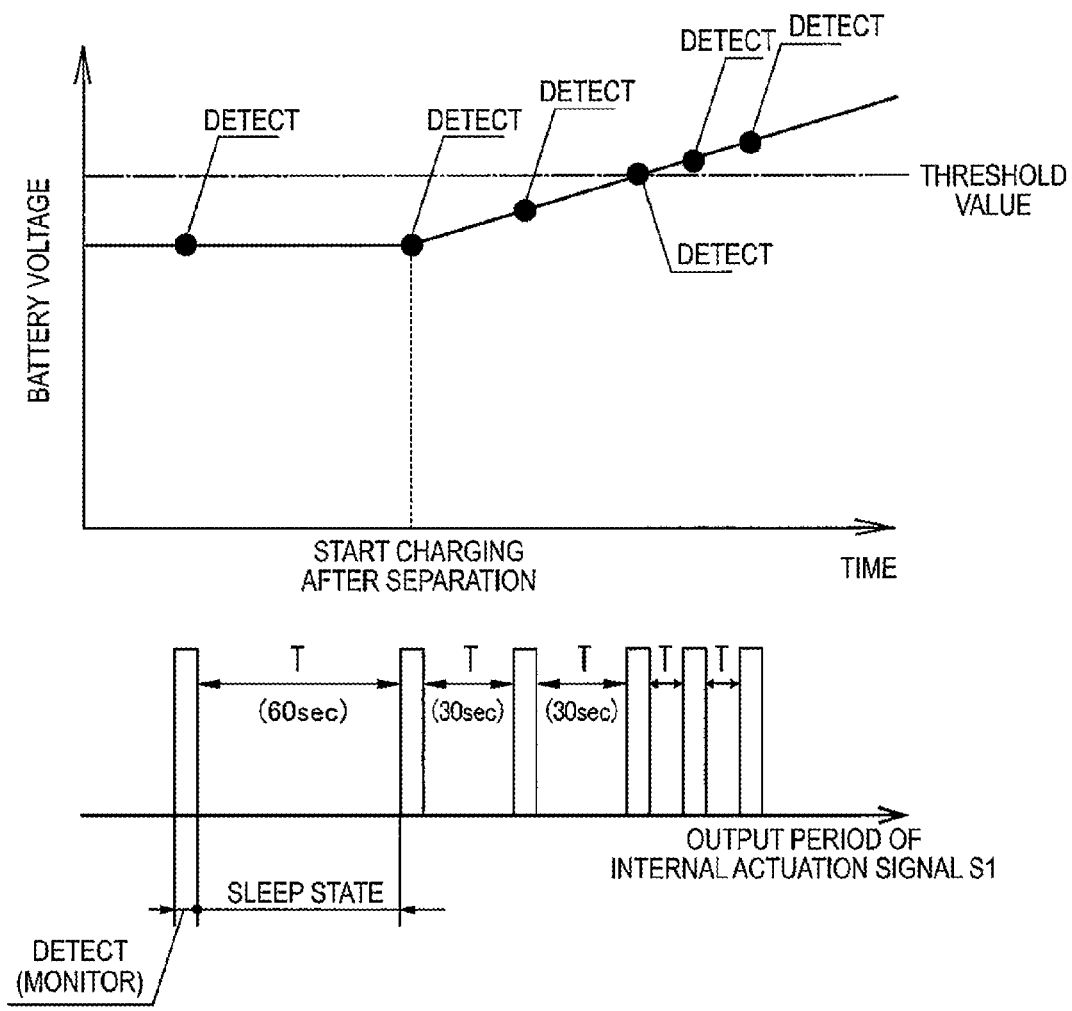
FIG. 4 is a graph illustrating an actuation period with which the monitor is actuated if the battery voltage is changed.

The secondary battery 10, the charger 20, the relay R and the monitor 30 may be removed and separated from the load, and the secondary battery 10 may be charged with power supplied from an external device or may be charged by a charger other than the built-in charger 20. In such a case, even if the monitor 30 is in the sleep mode, the voltage of the secondary battery 10 rises as illustrated in FIG. 4 and it is determined that the current detected voltage is changed from the previous detected voltage in S50. Accordingly, the number of continuous changes K is increased by one (S80), and it is determined that the increased number of continuous changes K is less than a threshold number of changes Kth (for example two) in S90. Further, it is determined that the current detected value is equal to or less than the threshold voltage Vth (S100: No). Then, the CPU 31 changes the set time of the wakeup timer 35 to a first change value (for example, 30 seconds) and shortens the actuation period T of the monitor 30 in S110. For example, as illustrated in FIG. 4, the CPU 31 changes the set time of the wakeup timer 35 from 60 seconds to 30 seconds and changes the actuation period T of the monitor 30 from the initial value of 60 seconds to 30 seconds.

After changing the actuation period T to the first change value, the monitor 30 is actuated at an interval of the first change value in subsequent monitoring. After changing the actuation period T, the process returns to S10. Then, the process proceeds to S20, S30 and S40 and if it is determined that the battery voltage does not change (S50: No), the CPU 31 resets the number of continuous changes K to be zero (S60) and also resets the set time period of the wakeup timer 35 to the initial value (S70). If it is again determined that the current battery voltage changes from the previous detected value (S50: Yes), and it is determined that the current detected value detected in S40 is equal to or less than the threshold voltage Vth (S100: No), the CPU 31 does not change the set time of the wakeup timer 35 and keeps the first change value (S110). The threshold voltage Vth is preferably close to the full charge voltage of the secondary battery 10.

If the battery voltage of the secondary battery 10 continuously changes with respect to a time axis as illustrated in FIG. 4, for example proportionally, the monitor 30 is repeatedly actuated at an interval of 30 seconds to monitor the secondary battery 10.

If the detected battery voltage changes consecutively several times, the CPU 31 determines that the secondary battery 10 is used in condition where the monitor cannot receive the external actuation signal Sb from the load side. If determining that the number of continuous changes K is over the threshold number Kth (S90: No), the CPU 31 changes the set time of the wakeup timer 35 to be a second change value that is shorter than the first change value (for example, 20 seconds) in S120. Accordingly, the actuation period T of the monitor 30 is further shortened. Therefore, the voltage is detected for several times at a shortened actuation period T. This reduces time required to determine that the secondary battery 10 is used in an improper state.

In the present embodiment, the actuation period T is changed to be shortened if the secondary battery 10 is improperly used. Therefore, compared to a case where the actuation period T of the monitor 30 is not changed from the initial value even if the secondary battery 10 is improperly used, it is promptly detected that the secondary battery 10 is used in an improper state that the monitor 30 cannot receive the external actuation signal Sb from the load side. If detecting that the secondary battery 10 is used in an improper condition that the monitor 30 cannot receive the external actuation signal Sb from the load side, the CPU 31 of the monitor 30 performs an informing process that informs an error using an error notification lamp or a buzzer for example (S130).

If the actuation period T is kept to be long, the secondary battery 10 is not monitored by the monitor 30 for a long time. Thus, if the secondary battery 10 is charged for a long time without monitoring and the battery voltage reaches a prohibited level, overcharge or over discharge may be caused in the secondary battery 10 and the secondary battery 10 may become in an abnormal state. However, in the present embodiment, the actuation period T of the monitor 30 is shortened and this shortens a monitoring interval of the secondary battery 10. Therefore, the CPU 31 may disconnect the relay R (S130) to stop charging before the secondary battery 10 is overcharged. Therefore, the secondary battery 10 is not overcharged.

In determining that the number of continuous changes K is less than the threshold number Kth (S90: Yes) and determining that the current detected value that is detected in S40 is greater than the threshold voltage Vth (S100: Yes), the CPU 31 changes the set time of the wakeup timer 35 to the second change value (S120). Accordingly, as illustrated in FIG. 4, the CPU 31 may further shorten the actuation period T of the monitor 30, and the secondary battery 10 is not overcharged.

Second Embodiment

Figure 5:
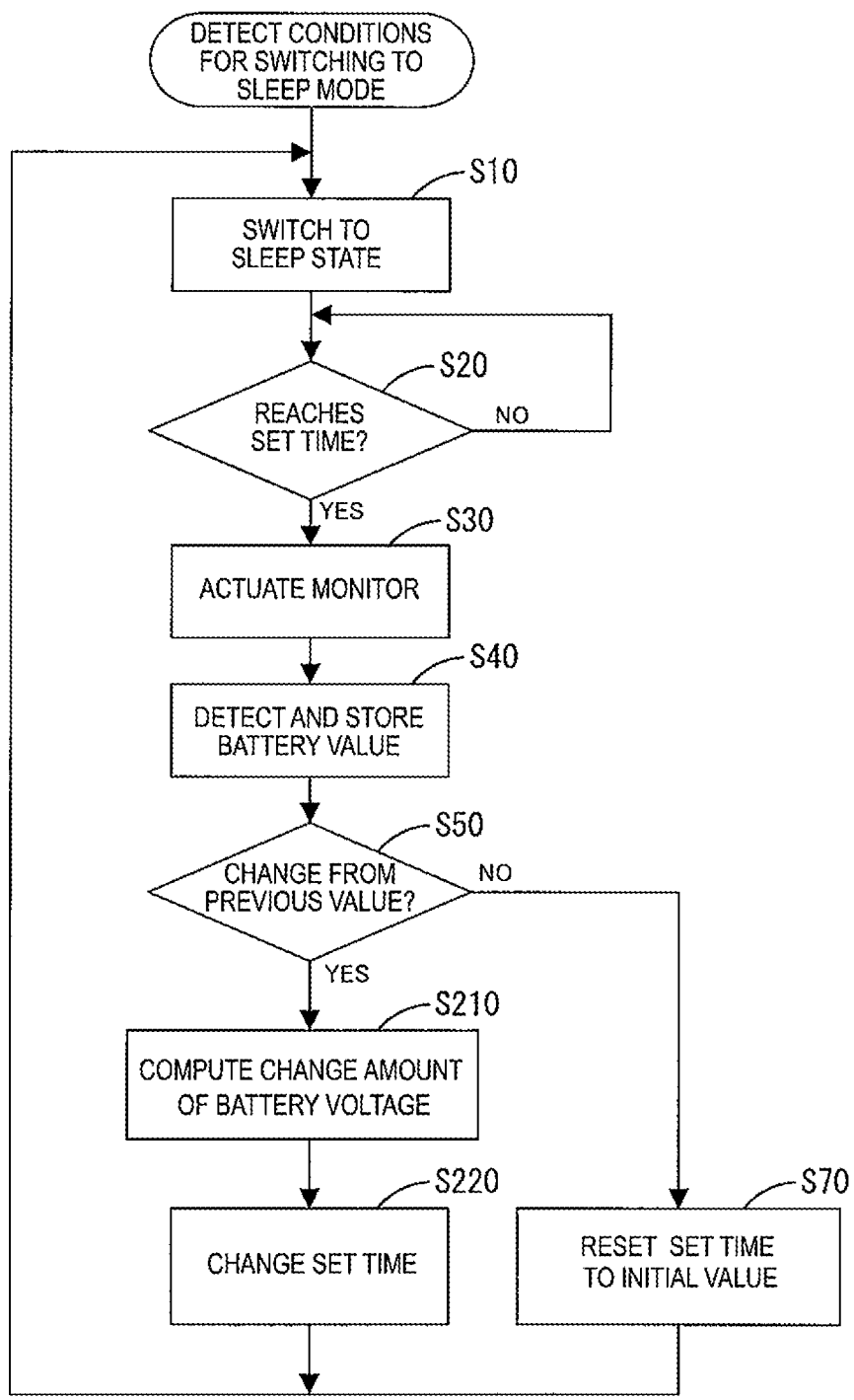
FIG. 5 is a flowchart illustrating a flow of processing of an actuation period change sequence according to a second embodiment.
Figure 6:
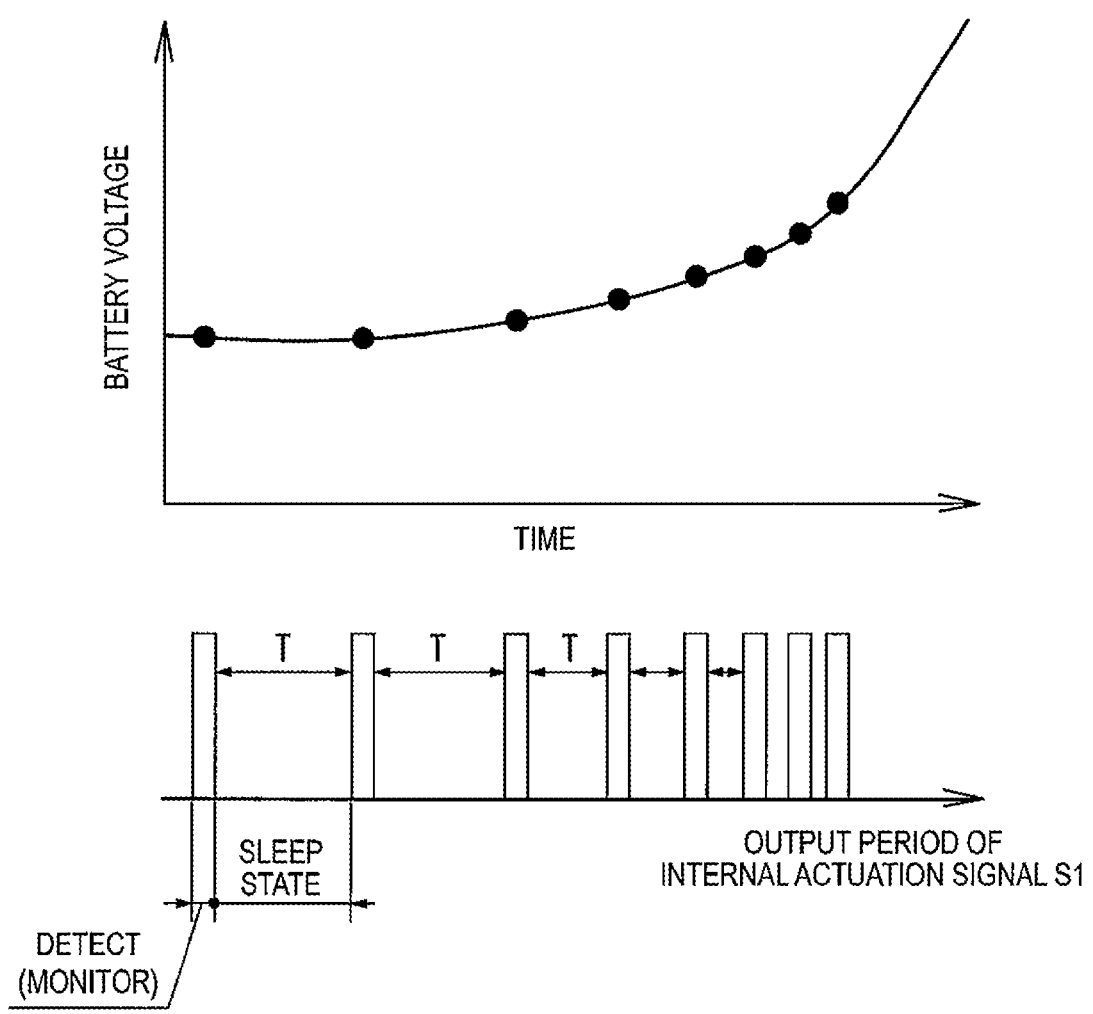
FIG. 6 is a graph illustrating an actuation period of a monitor.

Next, a second embodiment will be described with reference to FIGS. 5 to 7. In the first embodiment, the voltage of the secondary battery 10 proportionally changes with respect to the time axis and changes the actuation period T of the monitor 30 from 60 seconds to 30 seconds.

In the second embodiment, the CPU 31 compares the current detected voltage and the previous detected voltage and obtains a change amount of the battery voltage every time determining that the current voltage changes from the previous voltage. Specifically, if determining that the current detected voltage changes from the previous detected voltage (S50: Yes), the CPU 31 computes a change amount between the previous detected voltage and the current detected voltage (S210). As the change amount becomes greater, the CPU 31 changes the set time of the wakeup timer 35 to be a shorter value (S220). Accordingly, the greater the change amount of the detected battery voltage values is, the shorter the actuation period T becomes. For example, if the battery voltage changes along a substantially quadratic curve with respect to the time axis as illustrated in FIG. 6, the actuation period T of the monitor 30 is changed to be shorter as time passes.

In the second embodiment, if the change amount of the battery voltages becomes larger and the current detected voltage is close to the full-charge voltage, the actuation period T is further shortened. Therefore, the monitor 30 monitors the secondary battery 10 more frequently. Therefore, the secondary battery 10 is not overcharged. An olivine-type lithium-ion iron second battery has characteristics as illustrated in FIG. 6, and in the olivine-type lithium-ion iron second battery, the voltage rises drastically at a terminal stage of charging. The olivine-type iron battery is a kind of lithium-ion batteries and has a positive electrode made of olivine-type iron phosphate, that is, lithium iron phosphate (LiFePO4) and a negative electrode made of, for example, carbon. The olivine-type lithium-ion iron secondary battery has a full-charge voltage of about 3.5 V as illustrated in FIG. 7. Therefore, if the olivine-type lithium-ion iron secondary battery is set such that the voltage drastically rises in a range between 3.45V and 3.5 V that is close to the full-charge voltage, the actuation period T is also shortened at the voltage between 3.45 V and 3.5 V. Accordingly, the olivine-type lithium-ion iron secondary battery 10 can be monitored more frequently at the voltage close to the full-charge voltage. Therefore, the olivine-type lithium-ion iron secondary battery is not overcharged.

Third Embodiment

Next, a third embodiment will be described with reference to FIG. 8. An actuation period change sequence of the third embodiment is substantially same as the sequence of the second embodiment including steps S10 to S220 and additionally includes processing of S3 and S5 in FIG. 7. Therefore, the processing of S3 and S5 will be explained.

Figure 8:
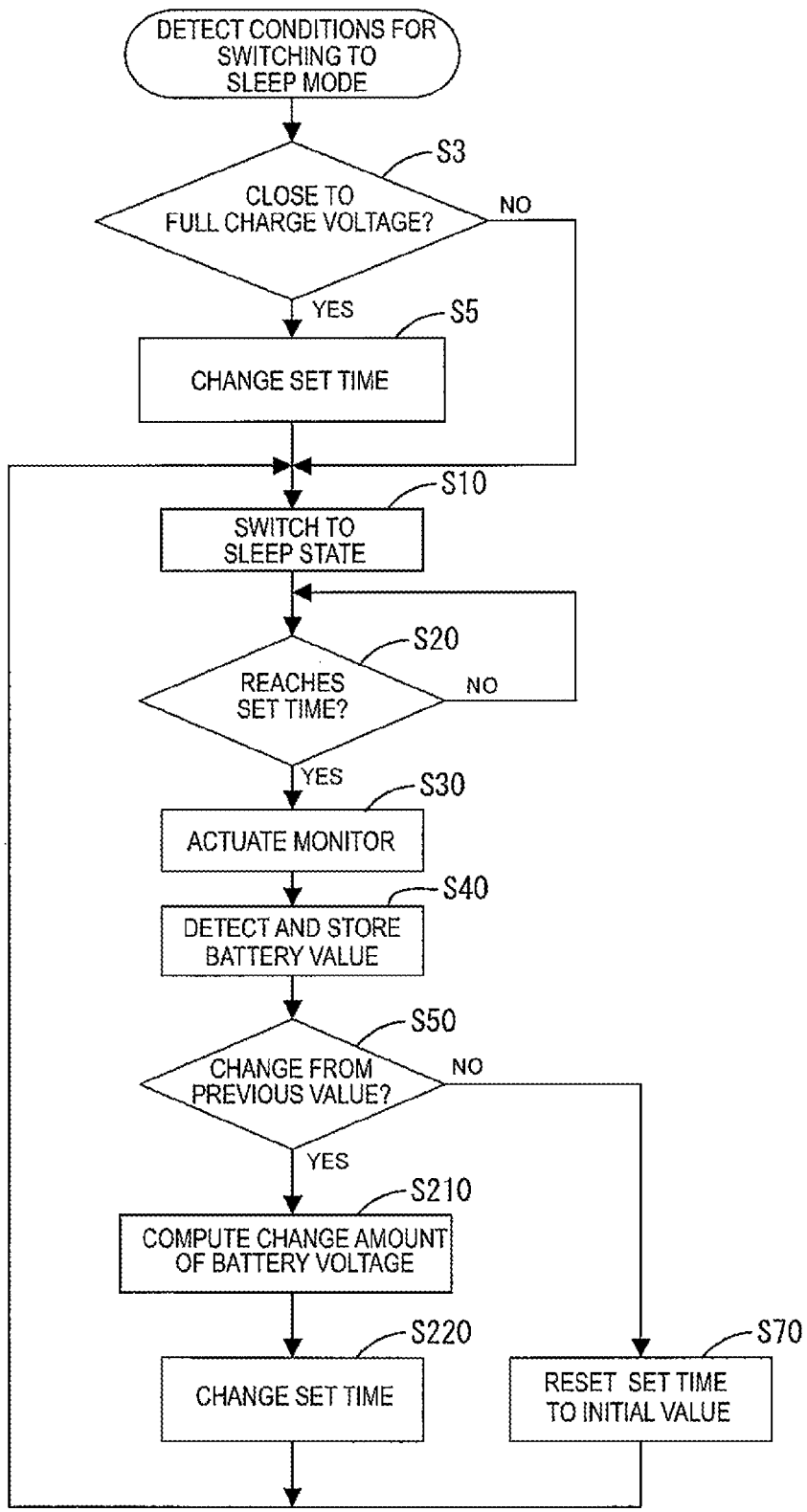
FIG. 8 is a flowchart illustrating a flow of processing of an actuation period change sequence according to a third embodiment.

As shown in FIG. 8, in the third embodiment, if the CPU 31 detects that the conditions for switching the monitor 30 to the sleep mode are satisfied and receives the sleep signal Sa output from the load side, the CPU 31 of the monitor 30 determines whether the most recent battery voltage of the secondary battery 10 detected in the measurement mode is close to a full-charge voltage or not (S3). Specifically, the CPU 31 compares the most recent battery voltage to a threshold voltage Vth that is previously set (a value close to the full-charge voltage). If determining that the most recent battery voltage is higher than the threshold voltage Vth, the CPU 31 determines that the most recent battery voltage is close to the full-charge voltage (S3: Yes). If determining that the most recent battery voltage is less than the threshold voltage, the CPU 31 determines that the most recent battery voltage Vth is not close to the full-charge voltage (S3: No).

If the CPU 31 determines that the most recent battery voltage is not close to the full-charge voltage (NO: S3), the process proceeds to S10. Processing executed after S10 is same as that in the second embodiment. In the sleep state, if the detected voltage of the secondary battery 10 is not changed from the previous detected value (S50: No), the monitor 30 is actuated with an actuation period T of 60 seconds to monitor the secondary battery 10 (S70). If the current detected voltage is changed from the previous detected value (S50: Yes), the actuation period T is changed (S60).

Next, if the CPU 31 determines that the most recent battery voltage is close to the full-charge voltage (YES: S3), the process proceeds to S5. In S5, the CPU 31 changes the set time of the wakeup timer 35 to a time shorter than an initial value. The initial value of the set time of the wakeup timer 35 is 60 seconds, and the set time is changed to a time shorter than that. For example, 30 seconds is set to the wakeup timer 35 in S5. Accordingly, immediately after being switched to the sleep mode, the monitor 30 is actuated with an actuation period T that is shorter than the initial setting and monitors the secondary battery 10.

In such a manner, if the voltage of the secondary battery 10 is close to the full-charge voltage before the monitor 30 being switched from the measurement mode to the sleep mode, the actuation period T of the monitor 30 is set to a small value. Therefore, the secondary battery is not overcharged.

Other Embodiments

The present invention is not limited to the above description and the drawings. For example, the following embodiments are covered by the technological scope of the invention.

(1) In the above embodiments, the monitor 30 monitors the state of the secondary battery 10. However, the target to be monitored by the monitor 30 is necessarily a storage element (electricity storing element), and the state of a capacitor may be monitored by the monitor 30. Further, in the above embodiments, the control device is the CPU 31. However, the control device may be a hardware circuit.

(2) In the above embodiments, if the voltage of the secondary battery 10 is changed from the previous detected value, the actuation period T of the monitor 30 is changed. For example, the CPU 31 may detect a temperature of the secondary battery 10 and determine whether the detected temperature of the secondary battery 10 is changed from the previous detected value. If determining that the detected temperature is changed from the previous value, the CPU 31 may change the actuation period T of the monitor 30.

Besides the battery temperature, the information denoting the state of the secondary battery 10 may include any information from which the CPU 31 can detect the possibility of occurring abnormality of the battery such as a state of charge (SOC), a current value, or an internal pressure of the battery.

A current of the secondary battery 10 may be detected to detect the state of the battery 10. A dark current dissipated by the battery 10 while a vehicle being parked may be detected to determine whether the actuation period T may be changed or not. Specifically, in a system in which the dark current dissipated by the secondary battery 10 while a vehicle being parked is 100 mA or less, if determining that the dark current is a normal value and is less than 100 mA, the CPU 31 sets the actuation period T of the monitor 30 to 60 seconds that is an initial value.

If determining that the dark current is 100 mA or higher, the CPU 31 may change the actuation period T of the monitor 30 from 60 seconds to 30 seconds or may shorten the actuation period T in a stepwise manner according to the level of the dark current. For example, in the secondary battery 10 having a capacity of 60 Ah, the actuation period T is changed according to the level of the dark current as follows. If the dark current is from 100 mA to 0.1 CA (6 A), the actuation period T is set to 30 seconds. If the dark current is from 0.1 CA (6 A) to 0.5 CA (30 A), the actuation period T is set to 20 seconds. If the dark current is 0.5 CA (30 A) or greater, the actuation period T is set to 10 seconds.

The actuation period T may be determined based on a plurality of detected values. For example, a current and a battery voltage may be detected and the CPU 31 may detect whether each of the values of the current and the battery voltage is equal to or greater than a corresponding certain level. If both of the detected values of the current and the battery voltage are the certain level or greater, the actuation period T may be further shortened as compared to a case in which only one of them is greater than the corresponding certain level. In such a case, the measurement unit 41 is a current sensor that detects a current flowing through the secondary battery 10, and a current is detected by the current sensor and the detected value corresponds to a detected current.

(3) In the above embodiments, the actuation period T of the monitor 30 is changed if the detected value of the secondary battery 10 is changed from the previous detected value. The target value to be compared with the current detected value of the secondary battery 10 may be a value that is detected prior to the last value that is detected at last or a reference value that is previously stored in the RAM 45. Therefore, if the current detected value of the secondary battery 10 is changed from the value detected prior to the last value or the reference value, the actuation period T of the monitor 30 may be changed.

(4) In the above embodiments, the voltage of the secondary battery 10 is increased from the previous detected value (charging). However, the voltage of the secondary battery 10 may be decreased from the previous detected value (discharging). Also in the case where the voltage of the secondary battery 10 is decreased from the previous detected value, the actuation period T may be shortened to shorten the monitoring interval at which the monitor 30 is monitored.

(5) In the above embodiments, the monitor 30 is switched from the measurement mode to the sleep mode if the CPU 31 of the monitor 30 receives the sleep signal Sa output from the side of load. However, the monitor 30 may detect the conditions for switching to the sleep mode without receiving any signal from the external device and if detecting the conditions, the monitor 30 may be switched to the sleep mode.

(6) In the above embodiments, each of the sleep signal Sa and the external actuation signal Sb is an independent signal. However, the two signals Sa and Sb may be configured with a single signal. The single signal may be set to a high level or a low level to control switching the mode of the monitor 30.

(7) In the above embodiments, the actuation period T of the monitor 30 is changed if the voltage of the secondary battery 10 is changed from the previous detected value. In addition to this, the CPU 31 may further detects if a current is flowing through the secondary battery 10 to determine whether to change the actuation period T or not. The CPU 31 changes the actuation period T of the monitor 30 if detecting that the current detected voltage of the secondary battery 10 is changed from the previous detected value and a current is flowing through the secondary battery 10.

Accordingly, the following effects are obtained. Generally, the battery voltage changes for a while after completion of charging or discharging. Therefore, if the actuation period T is changed only based on a change in the battery voltage, the actuation period T may be changed even in an ordinary state where the battery is not charged improperly. However, if the actuation period is changed based on a change in the battery voltage and detection that the current is flowing through the battery, the actuation period T is not changed in the ordinary state. Thus, the actuation period T is changed only when the battery is used (charged) improperly.

(8) In the second embodiment, the larger the change amount of the measured battery voltage value is, the more the actuation period T is shortened. The actuation period T may be changed in any other methods according to the change amount of the detected value. For example, the actuation period T of the monitor 30 may be changed in accordance with any one of the following patterns.

Figure 7:
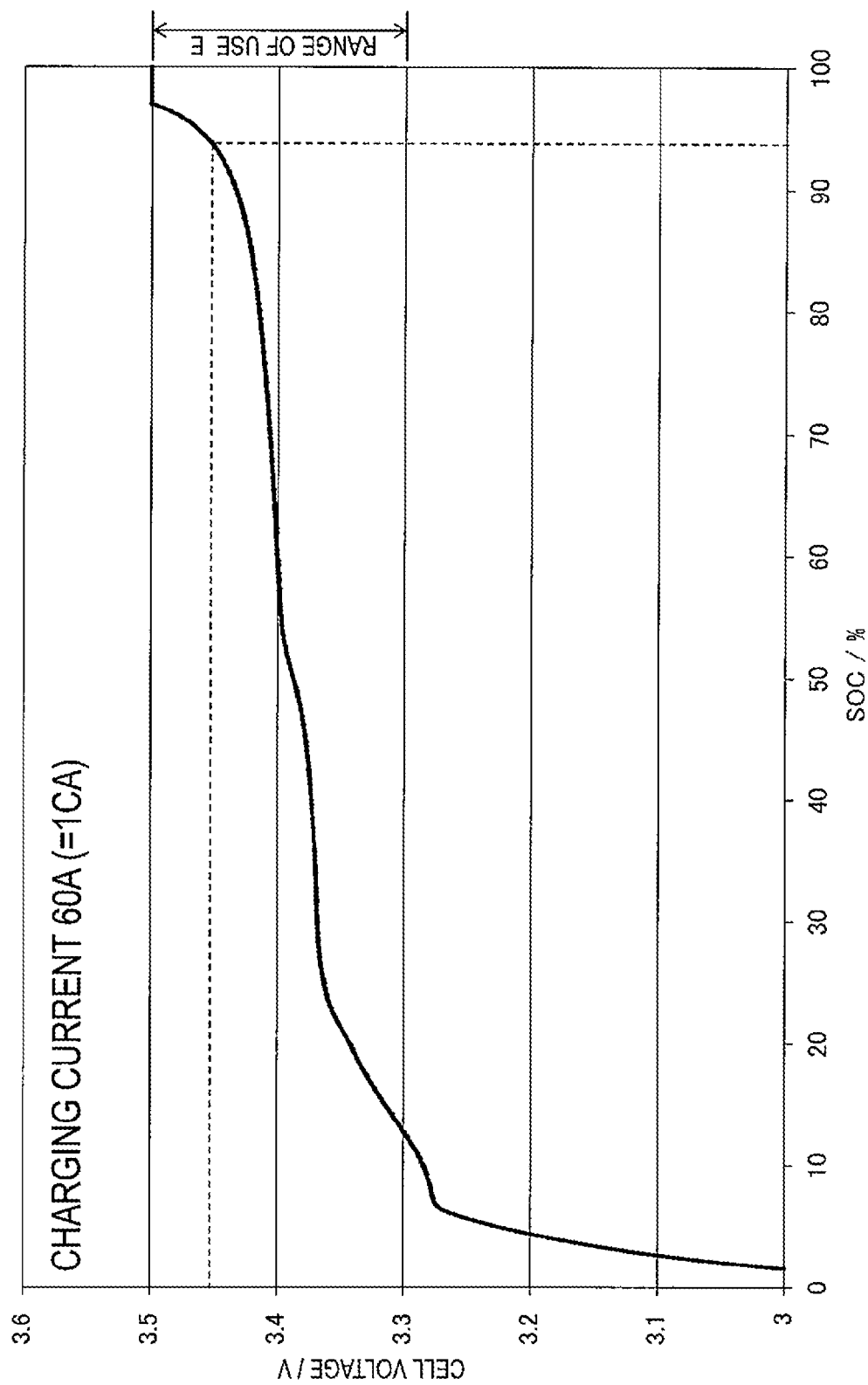
FIG. 7 is a graph illustrating charging characteristics of an olivine iron-type lithium-ion secondary battery.

As illustrated in FIG. 7, in the olivine-type lithium ion iron secondary battery, the full-charge voltage is about 3.5 V, and the battery is preferably used with the charged voltage being between 3.3 V and 3.5 V. In this case, a range of use E of the battery is 200 mV from 3.3 V to 3.5 V and the battery can be preferably used in this range, and 10% thereof is 20 mV. If the detected value is not changed from the previous value and the actuation period T is set to the initial value of 60 seconds, the actuation period T may be changed in the following methods.

Pattern 1: If the detected value is changed from the previous detected value by 20 mV that is 10% of the range of use, the actuation period T is changed from 60 seconds to 30 seconds that is a half of the initial value.

Pattern 2: If the detected value is changed from the previous detected value by 40 mV that is 20% of the range of use, the actuation period T is changed from 60 seconds to 15 seconds that is a quarter of the initial value.

Pattern 3: If the detected value is changed from the previous detected value by 20 mV and the actuation period T is changed from the initial value of 60 seconds to 30 seconds and then the subsequent detected value is changed from the previous value by 40 mV, the actuation period T is changed from 30 seconds to 15 seconds that is a half of 30 seconds. If the detected value is changed by the change amount same as the previous change amount of 20 mV, the actuation period T is not changed and maintained to be 30 seconds.

The actuation period T may be changed by multiplying the actuation period T by a constant (½ or ¼) corresponding to the change amount of the detected value as described above, and further, the actuation period T may be changed by subtracting a constant (20 seconds or 40 seconds) that is determined corresponding to the change amount of the detected value from the current actuation period T.

(9) In the above embodiments, the actuation period T of the monitor 30 is changed if the battery voltage of the secondary battery 10 is changed from the previous detected value. However, the actuation period T may be changed if the CPU 31 detects that the battery voltage of the secondary battery 10 is not changed from the previous detected value or a reference value.

Specifically, if the current detected value is not changed from the previous detected value, it is unlikely that the secondary battery 10 is used improperly. Thus, even if the actuation period of the monitor 30 is extended, it is unlikely that any error is caused in the secondary battery 10. The actuation period T is 60 seconds that is the initial value and if the current detected value is not changed from the previous value, the actuation period T may preferably be set to 90 seconds or 120 seconds that is longer than the initial value. The actuation period T becomes longer and this reduces the power consumption of the monitor 30.

The actuation period T may be changed if the battery voltage of the secondary battery 10 is not changed from the previous detected value or the reference value, and also the actuation period T may be changed if the current detected value is changed from the previous detected value.

Figure 9:
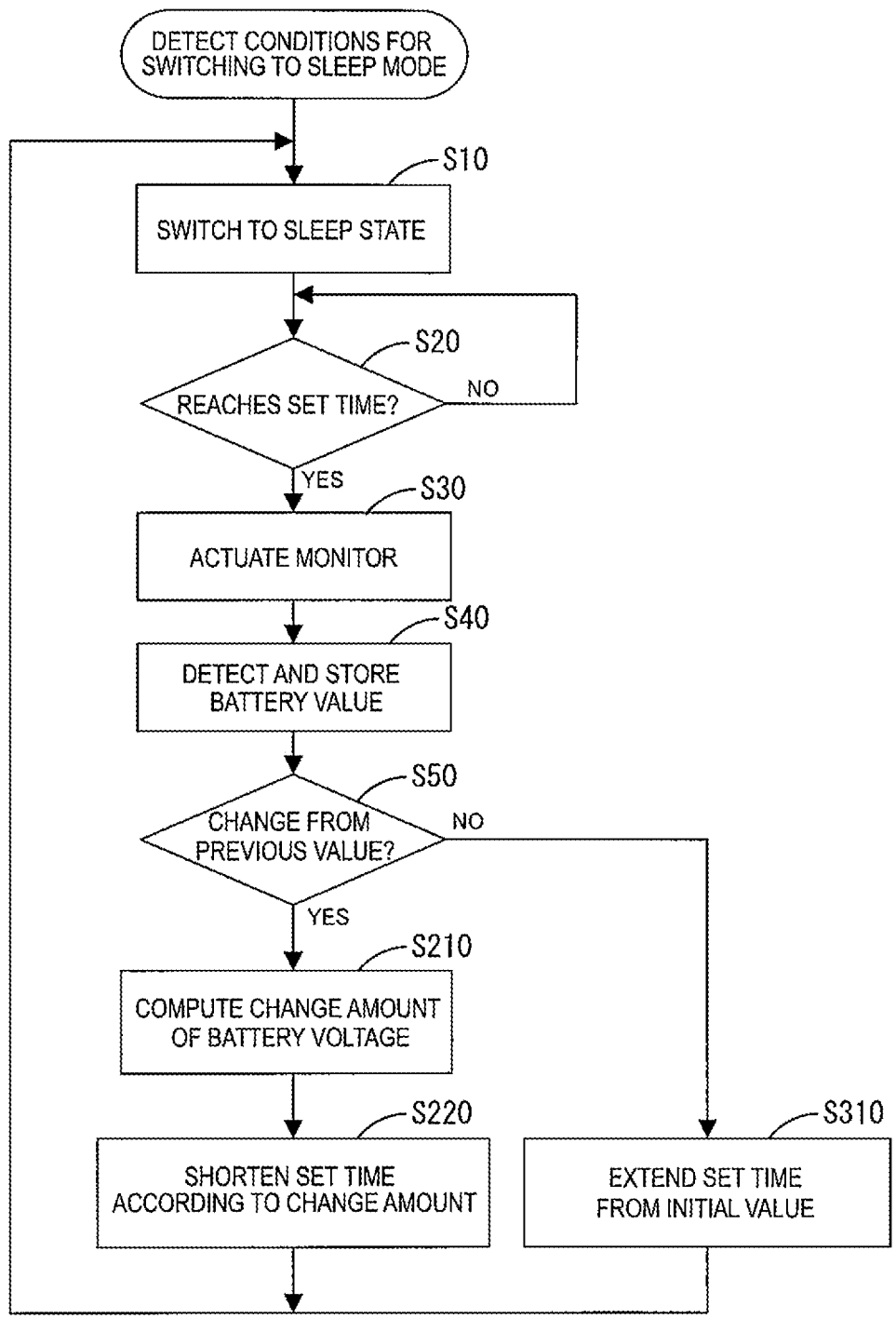
FIG. 9 is a flowchart illustrating a flow of processing of an actuation period change sequence according to another embodiment.

As illustrated in FIG. 9, if determining that the current detected voltage changes (S50: Yes), the CPU 31 computes a change amount between the previous detected value and the current detected value (S210), and the CPU 31 changes the set time of the wakeup timer 35 to be a shorter value as the computed change amount is greater (S220). If determining that the current detected voltage does not change (s50: No), the CPU 31 may change the set time of the wakeup timer 35 to be a value that is longer than the initial value.

According to the present technology, the monitor can deal with a case that the monitor cannot receive an actuation signal from the load side.

The invention claimed is:

1. A monitor for monitoring an electric storage device comprising:
 a measurement unit configured to detect a state of the electric storage device and obtain a detected value;
 a power supply switch portion configured to switch a power supply state of the monitor between a monitoring state and a low power consumption state that requires lower power than the monitoring state;
 a wakeup timer to which actuation time is set and configured to start counting time in response to switching to the low power consumption state by the power supply switch portion, continue counting time until reaching the actuation time and output an internal actuation signal if reaching the actuation time; and
 a memory configured to store a previous detected value that is detected prior to the detected value, wherein:
 the power supply switch portion switches the power supply state of the monitor from the low power consumption state to the monitoring state every time the wakeup timer outputs the internal actuation signal, the monitor further comprising:
 a control unit configured to:
  control the measurement unit to detect the state of the electric storage device and obtain the detected value when the power supply state of the monitor is set in the monitoring state by the power supply switch portion;
  obtain a change amount according to comparison between the detected value and the previous detected value; and
  change the actuation time according to the change amount.

2. The monitor according to claim 1, wherein:
 the control unit is further configured to
  compare the detected value and the previous detected value;
  determine if the detected value changes from the previous detected value; and
  shorten the actuation time according to first determination that the detected value changes from the previous detected value.

3. The monitor according to claim 2, wherein:
 the control unit is further configured to:
  obtain a change amount according to comparison between the detected value and the previous detected value; and
  shorten the actuation time to be shorter as the change amount becomes greater.

4. The monitor according to claim 2, wherein the control unit is further configured to:
 determine if the detected value is close to a full-charge voltage when the power supply switch portion switches the power supply state to the low power consumption state; and
 shorten the actuation time from an initial value according to second determination that the detected value is close to the full-charge voltage.

5. The monitor according to claim 2, wherein:
 the measurement unit detects voltage and a current value of the electric storage device;
 the control unit is further configured to:
  compare the detected voltage and the previous detected voltage;
  determine if the detected voltage changes from the previous detected voltage and if current is flowing through the electric storage device based on the detected current value and make third determination that the detected voltage changes from the previous detected voltage and the current is flowing through the electric storage device; and
  shorten the actuation time according to the third determination.

6. The monitor according to claim 2, wherein the monitor is configured to monitor an olivine-type lithium-ion iron secondary battery having a positive electrode made of olivine-type iron phosphate.

7. The monitor according to claim 2, wherein:
 the control unit is further configured to
  compare the detected value and the previous detected value;
  determine if the detected value changes from the previous detected value; and
  extend the actuation time according to fourth determination that the detected value does not change from the previous detected value.

8. The monitor according to claim 3, wherein:
 the control unit is further configured to
  compare the detected value and the previous detected value;
  determine if the detected value changes from the previous detected value; and
  extend the actuation time according to fourth determination that the detected value does not change from the previous detected value.

9. The monitor according to claim 1, wherein:
 the measurement unit detects voltage and a current value of the electric storage device;
 the control unit is further configured to:
  compare the detected voltage and the previous detected voltage;
  determine if the detected voltage changes from the previous detected voltage and if current is flowing through the electric storage device based on the detected current value and makes third determination that the detected voltage changes from the previous detected voltage and the current is flowing through the electric storage device; and
  change the actuation time according to the third determination.

10. The monitor according to claim 1, wherein:
 the control unit is further configured to
  compare the detected value and the previous detected value;
  determine if the detected value changes from the previous detected value; and extend the actuation time according to fourth determination that the detected value does not change from the previous detected value.

11. The monitor according to claim 1, further comprising a communication interface for receiving an external actuation signal that causes the power supply switch portion to switch the power supply state of the monitor from the low power consumption state to the monitoring state.

12. The monitor according to claim 11, wherein the control unit is configured to change the actuation time according to the change amount when the communication interface does not receive the external actuation signal.

* * * * *